United States Patent [19]
Rolfson

[11] Patent Number: 5,786,116
[45] Date of Patent: Jul. 28, 1998

[54] ATOM LITHOGRAPHIC MASK HAVING DIFFRACTION GRATING ALIGNED WITH PRIMARY MASK PATTERN

[75] Inventor: J. Brett Rolfson, Boise, Id.

[73] Assignee: Micron Technology, Inc., Boise, Id.

[21] Appl. No.: 799,166

[22] Filed: Feb. 14, 1997

[51] Int. Cl.$^6$ ............................................. G03F 9/00
[52] U.S. Cl. ........................................ 430/5; 430/313
[58] Field of Search ............................ 430/5, 322, 313; 378/34.35

[56] References Cited

U.S. PATENT DOCUMENTS

| | | | |
|---|---|---|---|
| 4,326,805 | 4/1982 | Feldman et al. | 356/399 |
| 5,240,796 | 8/1993 | Lee et al. | 430/5 |
| 5,587,834 | 12/1996 | Noguchi | 430/5 |
| 5,624,773 | 4/1997 | Pforr et al. | 430/5 |

OTHER PUBLICATIONS

Kang, Ho-Young et al., A new Method of Tilted Illumination using Grating Mask; ATOM (Advanced Tilted illumination On Mask), SPIE vol. 1927 Optical Laser Microlithography VI, p. 226, Mar. 1993.

Primary Examiner—S. Rosasco
Attorney, Agent, or Firm—Stephen A. Gratton

[57] ABSTRACT

An ATOM lithographic mask includes a transparent substrate having both a primary mask pattern and a diffraction grating. The diffraction grating includes chromeless phase shifters configured to diffract exposure energy directed through the substrate to provide off axis illumination for the primary mask pattern. The primary mask pattern can include a patterned opaque layer having an alignment mark formed therein. The alignment mark can be used during fabrication of the mask for accurately aligning the grating pattern and the primary mask pattern. Because of the accurate alignment, the layout, orientation and pitch of the diffraction grating with respect to the primary mask pattern, can be selected to optimize image formation from the mask pattern.

36 Claims, 3 Drawing Sheets

ATOM LITHOGRAPHIC MASK HAVING DIFFRACTION GRATING ALIGNED WITH PRIMARY MASK PATTERN

FIELD OF THE INVENTION

This invention relates generally to lithography and specifically to an improved lithographic mask, to a method for making the mask, and to a lithographic system including the mask.

BACKGROUND OF THE INVENTION

Photolithography is widely used in semiconductor manufacture and other applications. During photolithography, an exposure energy, such as ultraviolet light, is passed through a mask and onto a target such as a semiconductor wafer. The mask contains opaque and transparent regions which form a primary mask pattern. The exposure energy exposes the mask pattern on a layer of resist formed on the target. Following exposure, the layer of resist can be developed to form a resist mask. In semiconductor manufacture, such a resist mask can be used for etching, ion implantation and other processes.

One recently developed form of photolithography increases the resolution at the target by changing the manner in which the exposure energy illuminates the mask pattern. In particular the exposure energy is projected through the mask at an angle that is offset from an optical axis of the lithographic system. This illumination technique is referred to as "off-axis" or "tilted" illumination. Representative off-axis illumination techniques include annular illumination and multi-pole illumination.

FIG. 1 illustrates an off axis illumination lithographic system 10. The system 10 includes an exposure source 12 configured to emit a beam of exposure energy such as UV light. The exposure energy is initially directed along an optical axis 14 of the system 10. However, a screen 16 is positioned adjacent to the source 12 and includes an annular aperture 18. The annular aperture 18 is designed to eliminate the center portion of the beam of exposure energy emitted by the source 12. This blocks the on-axis "0" order unmodulated energy and allows the illumination to come from a left side illumination beam 20 and a right side illumination beam 22 that are off-axis with respect to the optical axis 14. The off-axis illumination beams 20, 22 are focused by a condenser 24 at oblique angles of incident (Θ) onto a mask 26. The mask 26 is located at the object plane of the lithographic system 10 and includes a transparent substrate 27 and opaque features 28 that form a primary mask pattern. After diffracting through the mask 26, the illumination beams 20, 22 are filtered by a spatial filter 30 and focused by an objective lens 34 onto a target 36. The spatial filter 30 includes an entrance pupil 32 which functions to prevent certain orders of the diffraction pattern from striking the target 36. Image formation now occurs by the interference of two beams being the "0" order and either the "+1" or "–1" diffracted beams.

One shortcoming of the off-axis illumination system 10 is that extensive modifications are required to a conventional lithographic system to provide the off-axis illumination. In addition, because the center of the exposure energy must be blocked, the illumination intensity is decreased. The low illumination intensity requires longer photoresist exposure times and decreases the throughput of the targets. Furthermore, the low illumination intensity can cause non-uniformity in the features imaged on the targets.

One recently developed method for off axis illumination places an additional grating mask between the exposure source and the primary mask. The grating mask includes a grating pattern for generating diffracted light. The light diffracted by the grating pattern provides off axis illumination for the primary mask pattern. Such a method is referred to as ATOM (Advanced Tilted Illumination On Mask). This method is described in the technical article by Kang et al. entitled "A new Method of Tilted Illumination using Grating Mask; ATOM (Advanced Tilted Illumination On Mask)", SPIE Vol. 1927, Optical/Laser Microlithography VI (1993) pg. 226.

FIG. 2 illustrates an ATOM lithographic system 38. The ATOM lithographic system 38 includes an exposure source 12, and an optical axis 14, as previously described. However, in the ATOM lithographic system 38 a screen 16A allows all of the exposure energy from the source 12 to impinge on the condenser 24. In addition, the condenser 24 rather than focusing on the primary mask 26, focuses the exposure energy on a grating mask 40.

The grating mask 40 comprises a transparent substrate 43 having a grating pattern of phase shift grooves 41 formed therein. The grating mask 40 is similar in construction to a chromeless phase shifting reticle formed with subtractive phase shifters. Light passing through a phase shift groove 41 is phase shifted relative to light passing through an adjacent full thickness portion of the substrate 43. The phase shift grooves 41 function as an ATOM grating to generate diffracted light having an odd numbered order. The resultant zero order diffraction light interferes destructively and the resultant first order diffraction light interferes constructively. The diffracted light impinging on the primary mask 26 comprises a "tilted" or "off axis" illumination beam. The ATOM lithographic system 38 increases the resolution (R) and the depth of focus (DOF) at the target 36. The resolution (R) and depth of focus (DOF) are a function of the angle of incident light ($\Theta_i$), the pitch of the grating members ($P_g$), the numerical aperture (NA), and the wavelength ($\lambda$) of the exposure energy. These relationships can be expressed by the formulae $\Theta_i = \sin^{-1}(\lambda/P_g)$ and $R = \lambda/2NA(1+\sin\Theta_i/NA) = \lambda/2NA(1+\alpha)$ where $\alpha = \sin\Theta_i/NA$.

One problem with the ATOM lithographic system 38 is that the grating pattern formed by the phase shift grooves 41 must be customized for a particular primary mask pattern formed by opaque features 28. This is because primary mask patterns with a certain pitch require a corresponding pitch for the grating pattern. Another problem is that the grating mask 40 is an additional component that must be aligned with respect to the primary mask 26. Any misalignment between the phase shift grooves 41 on the grating mask 40, and the opaque members 28 on the primary mask 26 can decrease the As effectiveness of the ATOM lithographic system 38.

The present invention is directed to an improved lithographic mask in which a primary mask pattern for imaging onto a target, and a diffraction grating for off axis illumination of the primary mask pattern are incorporated into the same mask. In addition, a mask fabrication process of the present invention allows the grating pattern and primary mask pattern to be aligned during the fabrication process.

SUMMARY OF THE INVENTION

In accordance with the present invention, an improved lithographic mask, a method for fabricating the mask, and a lithographic system utilizing the mask are provided. The mask includes a transparent substrate having a patterned opaque layer and an aligned diffraction grating formed thereon. The patterned opaque layer provides a mask pattern for exposing a layer of resist on a target using an exposure energy directed through the mask. The diffraction grating includes chromeless phase shift members configured to diffract the exposure energy to provide off axis illumination for selected portions, or features, of the mask pattern.

The mask can be fabricated from a standard mask blank comprising a quartz substrate and a chrome opaque layer. Initially, alignment openings can be formed in the opaque layer by etching through the opaque layer to the substrate using a resist mask. A layer of resist can then be deposited on the quartz side (e.g., backside) of the mask blank and flood exposed by directing exposure radiation through the alignment openings and substrate. Developing the layer of resist a first time forms alignment marks in the resist that can be used in forming the diffraction grating on the substrate. For forming the diffraction grating, a desired grating pattern can be written into the layer of resist in alignment with the alignment marks in the opaque layer using an optical or E-beam mask writer. The layer of resist can then be developed a second time to form a resist mask for etching the diffraction grating directly in the substrate or alternately in a previously deposited phase shifting layer.

With the diffraction grating formed in the substrate, the mask pattern can be formed in the opaque layer by forming another resist mask and etching the opaque layer to the substrate. Advantageously, the alignment marks initially formed in the opaque layer can be used to align and write the mask pattern into the opaque layer. The layout, orientation and pitch of the diffraction grating can be matched to the layout, orientation and pitch of the mask pattern to provide optimal enhancement of the features projected onto the target.

For example, the diffraction grating can be a simple line space pattern or alternately a checkerboard pattern. In both of these cases the orientation of the diffraction grating on the substrate can be generally parallel (0°) or generally perpendicular (90°) to the orientation of the mask pattern. However, the diffraction grating can also have an orientation of other than 0° or 90°, with respect to the orientation of the mask pattern. For example, the diffraction grating can have an orientation with respect to the mask pattern of from 1° to 89°. In addition, different diffraction gratings can be formed on the same mask with different orientations to match selected portions or features of the mask pattern.

The mask can be used in a lithographic system for exposing a layer of resist on a target such as a semiconductor wafer. The aligned diffraction grating increases the resolution (R) and the depth of focus (DOF) of the features projected upon the target by the mask pattern.

DETAILED DESCRIPTION OF THE PREFERRED EMBODIMENTS

As used herein, the term "mask" refers to an element that can be used directly to project a pattern onto a target during a lithographic process or to form a "working mask" by printing or other techniques. The term "mask pattern" refers to the features formed on the mask that will be projected onto the target. The term "diffraction grating" refers to a pattern of chromeless phase shifters, or other members, configured to produce diffracted light suitable for off axis illumination of a corresponding mask pattern. The term "chromeless phase shifter" refers to a transparent optical element configured to achieve a desired phase shift for exposure energy directed through the phase shifter relative to exposure energy directed through another portion of the mask.

Figure 1:
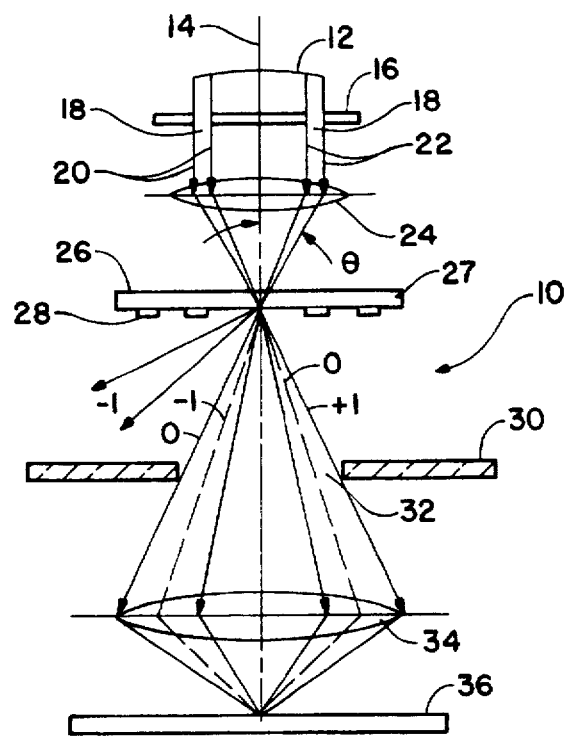
FIG. 1 is a schematic view of a prior art lithographic system having off-axis illumination.
Figure 2:
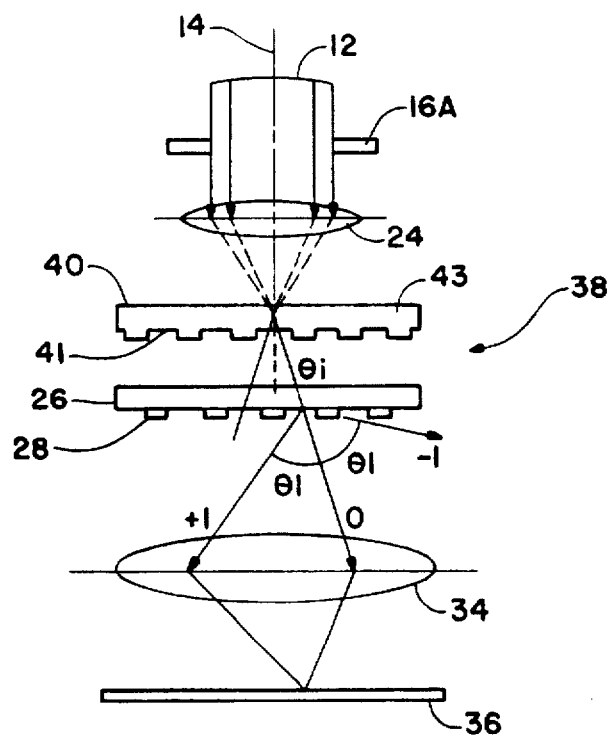
FIG. 2 is a schematic view of a prior art ATOM lithographic system utilizing a separate ATOM mask.
Figure 3A:
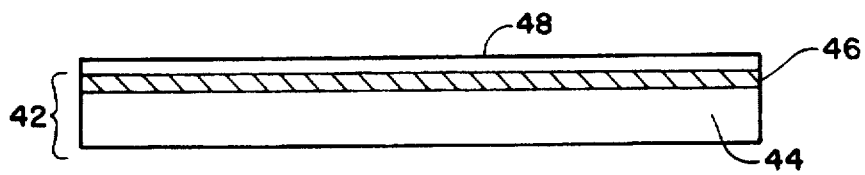
FIGS. 3A–3G are schematic cross sectional views illustrating steps in a method for forming a lithographic mask in accordance with the invention.

Referring to FIGS. 3A–3G, steps in a method for fabricating a mask in accordance with the invention are shown. Initially, as shown in FIG. 3A, a mask blank 42 is provided. The mask blank 42 includes a transparent substrate 44 and an opaque layer 46. Standard mask blanks are manufactured and sold by mask makers for use in lithography. One supplier is Dupont Photoblanks of Poughkeepsie, N.Y.

The substrate 44 can comprise a transparent material having suitable optical and mechanical properties for lithographic processes. Suitable materials include quartz and silica based glass. The opaque layer 46 can comprise a highly opaque material such as chrome, chromium, and chromium oxides. The opaque layer 46 can be blanket deposited on the substrate 44 and planarized to a standard thickness (e.g., 800–1200 Å).

As also shown in FIG. 3A, initially a layer resist 48 can be deposited on the opaque layer 46 to a desired thickness, exposed in a desired pattern and then developed. Exposure of the layer of resist 48 can be with an optical or an e-beam exposure system.

Figure 3B:
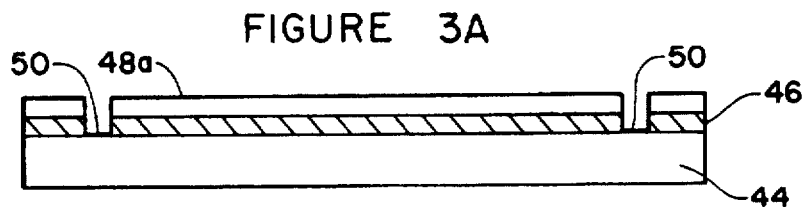

As shown in FIG. 3B, exposure and development of the layer of resist 48 forms a resist mask 48a having a desired pattern of alignment openings. The alignment openings in the resist mask 48a can be used to etch alignment marks 50 through the opaque layer 46 to the substrate 44. By way of example, an opaque layer 46 formed of chrome can be wet etched in a mixture of acetic acid and ceric ammonium nitrate at about 20° C. One suitable wet etchant is CR-14 manufactured by Cyantek Corporation.

The alignment marks 50 extend completely through the opaque layer 46 to the substrate 44 and can be formed with a desired size, spacing and peripheral shape. Preferably the alignment marks are large enough to be viewed by optics of a mask writer that will subsequently be used to pattern the opaque layer 46. Representative shapes for the alignment marks 50 include elongated grooves, circles, rectangles and crosses.

Figure 3C:
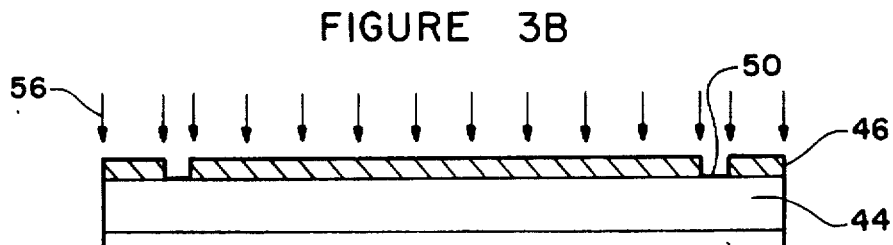
Figure 3D:
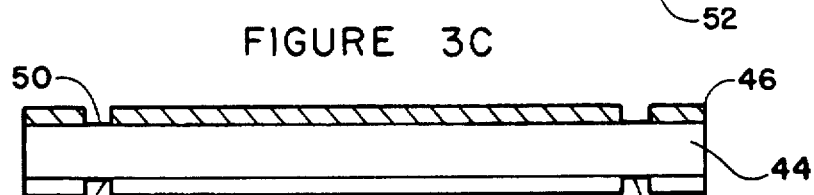

Next, as shown in FIG. 3C, a second layer of resist 52 is deposited on the quartz side (e.g., backside) of the substrate 44. The second layer of resist 52 can be exposed in desired areas by flooding exposure radiation 56 through the alignment marks 50 in the opaque layer 46 and through the substrate 44. As shown in FIG. 3D, with a positive tone resist, the layer of resist 52 can be developed a first time to form alignment openings 54. The alignment openings 54 correspond in size and shape to the alignment marks 50 in the opaque layer 46. Using the alignment openings 54 in the layer of resist 52 as reference marks, a desired grating pattern can be written onto the layer of resist 52 using an optical or e-beam mask writer. A suitable optical system for writing the grating pattern can include a laser mask writer, such as an "ALTA 3000" manufactured by Etec Systems Inc., Hayward, Calif. A suitable e-beam system for writing the grating pattern can include an e-beam mask writer such as a "MEBES 45001" manufactured by ETEC Systems, Inc., Hayward, Calif.

Figure 3E:
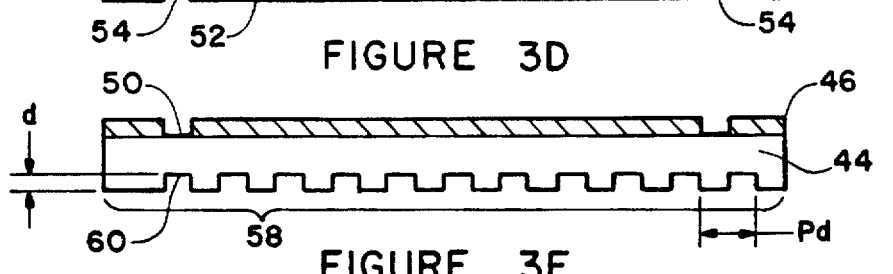

Next, as shown in FIG. 3E, developing the layer of resist 52 a second time forms a resist mask that can be used to etch the quartz substrate 44 to form a diffraction grating 58. The diffraction grating 58 comprises phase shift grooves 60 etched into the quartz substrate 44 to a depth "d". As will be further explained, the diffraction grating 58 functions as an ATOM grating for off axis illumination of a subsequently formed primary mask pattern 62 (FIG. 3G).

One suitable process for etching the phase shift grooves 60 into the substrate 44 is plasma dry etching. With a quartz substrate 44, an anisotropic dry etch process can be performed in an ion reactor using a gas etchant such as $CHF_3/O_2$. An isotropic etch process can also be performed using a suitable wet etchant such as a buffered oxide etchant (e.g., $NH_4F:HF$ mixture). Etching can also be performed using magnetically enhanced reactive ion etching (MERIE).

The depth "d" of the phase shift grooves 60 can be selected to achieve a desired phase shift for the exposure energy. This depth can be determined by the well known formula $d=i\lambda/2(n-1)$ where i=an odd integer λ=wavelength of exposure light and n=refractive index of phase shift material at the exposure wavelength.

By way of example, the depth "d" can be selected to provide a phase shift of 180° or odd multiple thereof for light passing through the phase shift grooves 60 relative to light passing through a full thickness of the substrate 44.

Figure 3G:
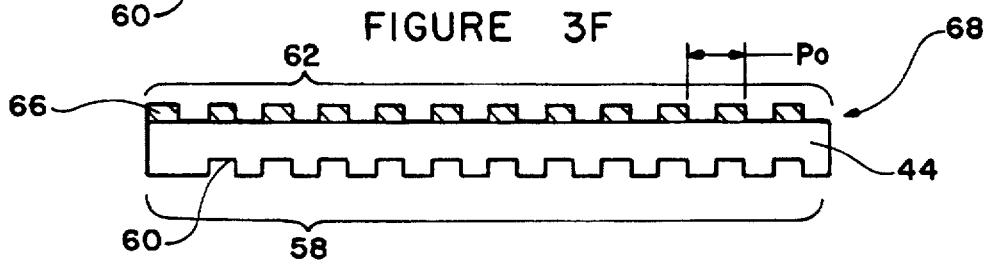
Figures 4A, 4B:
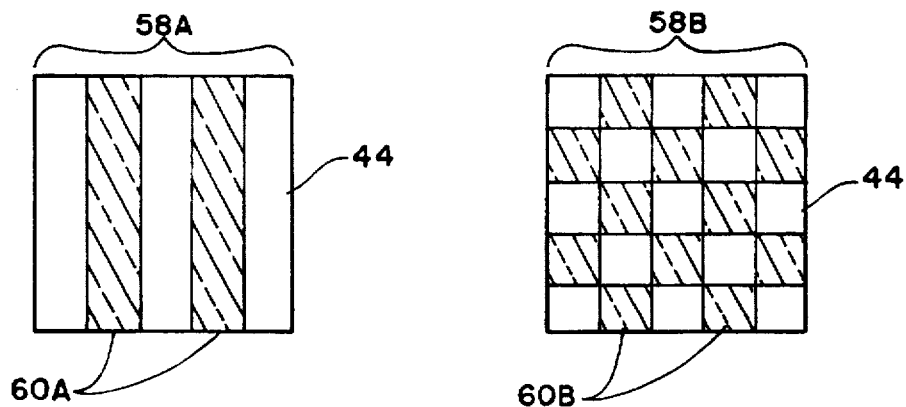
FIG. 4A is a schematic plan view of a lithographic mask constructed in accordance with the invention with a simple line space diffraction grating.
FIG. 4B is a schematic plan view of a lithographic mask constructed in accordance with the invention with a checkerboard diffraction grating.

Viewed from above the phase shift grooves 60 can be formed in a pattern that corresponds to the pattern of the primary mask pattern 62 (FIG. 3G) or selected portions of the primary mask pattern 62. For example, both the diffraction grating 58 (FIG. 3E) and the primary mask pattern 62 (FIG. 3G) can be simple line space patterns. FIG. 4A illustrates a simple line space diffraction grating 58A with the phase shift grooves 60A comprising elongated linear members.

Alternately, as shown in FIG. 4B, the phase shift grooves 60B can comprise squares arranged in a checker board diffraction grating 58B. In this case, the primary mask pattern 62 (FIG. 3G) can still be a simple line space pattern but each opaque feature 66 (FIG. 3G) will have multiple corresponding phase shift grooves 60B (FIG. 4B) associated therewith. The checker board diffraction grating 58B improves the printed image along axes that are parallel and perpendicular to the axes of the opaque features 66 (FIG. 3G).

Figure 3F:
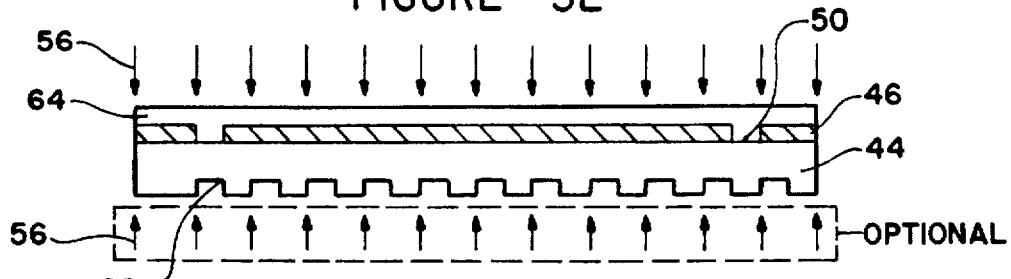

Referring to FIG. 3F, following the etch procedure for forming the phase shift grooves 60 for the diffraction grating 58 (FIG. 3G), the layer of resist 52 (FIG. 3D) can be stripped and a third layer of resist 64 can be deposited on the opaque layer 46. The pattern for the primary mask pattern 62 (FIG. 3G) can be exposed in the layer of resist 64 using exposure radiation 56 directed at the surface of the layer of resist 64. An optical or E-beam mask writer can be used, as previously explained, to expose or write the primary mask pattern into the layer of resist 64.

For aligning the primary mask pattern 62, the alignment marks 50 in the opaque layer 46 can be viewed using optics associated with the mask writer. Alternately, as indicated by the dotted box in FIG. 3G, exposure radiation 56 can be flooded through the substrate 44, and a new set of alignment marks (not shown) can be formed in the layer of resist 64 by developing the layer of resist 64 as previously explained for alignment marks 54 (FIG. 3D). The alignment marks (not shown) in the layer of resist 64 will correspond to the alignment marks 50 in the opaque layer 46 but may be clearer for viewing by the mask writer optics.

Following exposure, the layer of resist 64 can be developed to form a resist mask for etching the opaque layer 46 to form the primary mask pattern 62. As shown in FIG. 3G, the primary mask pattern 62 includes opaque features 66 having a pitch "Po". To form the opaque features 66, the opaque layer 46 can be etched using a suitable wet etchant such as acetic acid and ceric ammonium nitrate, as previously explained. The completed ATOM mask 68 includes the primary mask pattern 62 and the diffraction grating 58.

In general, the layout, orientation and pitch of the diffraction grating 58 (FIG. 3G) on the substrate 44 can be selected to provide optimal performance and image enhancement for the primary mask pattern 62 (FIG. 3G). In addition, the orientation of the diffraction grating 58 (FIG. 3G) can be generally parallel (0°) or generally perpendicular (90°) to the orientation of the primary mask pattern 62 (FIG. 3G) or to selected portions of the primary mask pattern 62. Relative orientations of 0° and 90° are sometimes referred to as "Manhattan" geometries.

Alternately, the diffraction grating 58 (FIG. 3G) can be oriented at an oblique angle (e.g. 45°) with respect to the primary mask pattern 62 (FIG. 3G) or portions of the mask pattern 62. Orientations other that 0° and 90° are sometimes referred to as "non-manhattan" geometries. Because an accurate alignment between the diffraction grating 58 (FIG. 3G) and primary mask pattern 62 (FIG. 3G) can be effected, the relative orientations of the patterns can be selected to achieve optimal feature enhancement.

Figure 5:
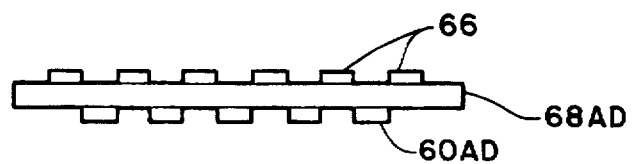
FIG. 5 is a schematic cross sectional view of an alternate embodiment lithographic mask constructed in accordance with the invention with additive chromeless phase shifters.

Referring to FIG. 5, an alternate embodiment mask 68AD is illustrated. In place of etched phase shift grooves 60 (FIG. 3G), the mask 68AD includes additive phase shift members 60AD formed using a deposition process. In this case a transparent phase layer (not shown) can be deposited on the substrate 44 and then patterned and etched to form the additive phase shift members 60AD. The additive phase shift members 60AD can have a thickness selected to produce a desired phase shift of π or odd multiple thereof.

Figure 6:
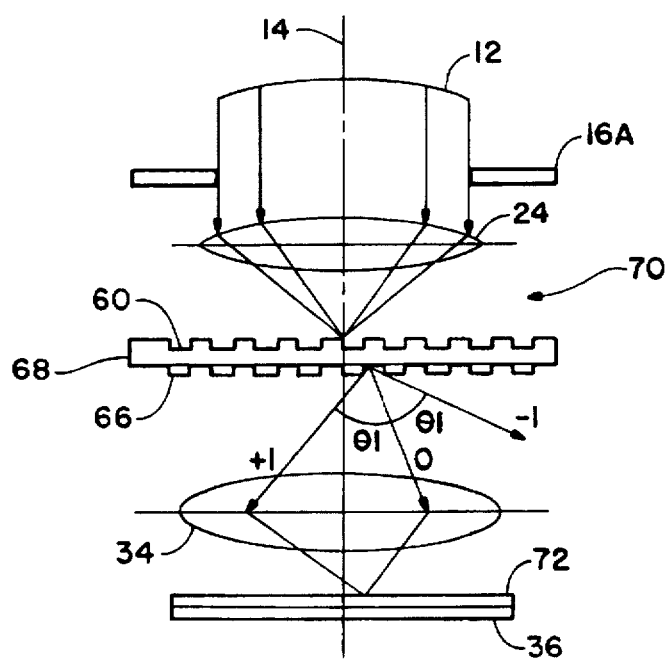
FIG. 6 is a schematic view of an ATOM lithographic system constructed utilizing a mask fabricated in accordance with the invention.

FIG. 6 illustrates the ATOM mask 68 in use in a lithographic system 70 during patterning of a layer of resist 72 formed on the target 36. The lithographic system 70 includes the exposure source 12 and the optical axis 14 as previously explained. In addition, the lithographic system 70 includes the condenser 24 and objective lens 34 as previously explained. In the system 70, the exposure energy directed by the exposure source 12 through the phase shift grooves 60 produces off axis illumination for the primary mask pattern 62 (FIG. 3G) formed by the opaque features 66. The off axis illumination improves the resolution (R) and depth of focus (DOF) of the corresponding features printed into the layer of photoresist 72 on the target 36.

While the invention has been described with reference to certain preferred embodiments, as will be apparent to those skilled in the art, certain changes and modifications can be made without departing from the scope of the invention as defined by the following claims.

What is claimed is:

1. A lithographic mask comprising:
   a transparent substrate having a first side and a second side separated by a thickness of the substrate;
   a mask pattern comprising a patterned opaque layer formed on the first side of the substrate; and
   a diffraction grating formed on the second side of the substrate in alignment with at least a portion of the mask pattern, the diffraction grating comprising a pattern of phase shift grooves etched in the second side of the substrate to a depth selected to diffract and phase shift exposure energy transmitted through the phase shift grooves relative to exposure energy transmitted through adjacent full thickness portions of the substrate to provide off axis illumination for the mask pattern.

2. The lithographic mask as claimed in claim 1 further comprising an alignment mark formed in the opaque layer for aligning the mask pattern to the diffraction grating.

3. A lithographic mask comprising:
   a transparent substrate having a first side and a second side separated by a thickness of the substrate;
   a mask pattern comprising a patterned opaque layer formed on the first side of the substrate;
   an alignment mark formed in the opaque layer; and
   a diffraction grating comprising a plurality of phase shift grooves formed on the second side of the substrate in alignment with the alignment mark, the diffraction grating comprising a pattern of phase shift grooves etched in the second side of the substrate to a depth selected to diffract and phase shift exposure energy transmitted through the phase shift grooves relative to exposure energy transmitted through adjacent full thickness portions of the substrate, to provide off axis illumination for the mask pattern.

4. The lithographic mask as claimed in claim 3 wherein the diffraction grating comprises a line-space pattern.

5. The lithographic mask as claimed in claim 3 wherein the diffraction grating comprises a checkerboard pattern.

6. The mask as claimed in claim 3 wherein a pitch, orientation and layout of the phase shift grooves are selected to enhance features printed onto a target by the mask pattern.

7. The mask as claimed in claim 3 wherein an orientation of the phase shift grooves with respect to an orientation of the mask pattern is 0° or 90°.

8. The mask as claimed in claim 3 wherein an orientation of the phase shift grooves with respect to an orientation of the mask pattern is between 1° to 89°.

9. A lithographic mask comprising:
   a transparent substrate having a first side and a second side;
   an opaque layer formed on the first side of the substrate; and
   a pattern of phase shift members formed on the second side of the substrate, the phase shift members comprising a transparent, patterned phase layer deposited on the second side to a thickness selected to phase shift and diffract exposure energy directed through the phase shift members relative to exposure energy directed through adjacent portions of the substrate to provide off axis illumination of the mask pattern.

10. The mask as claimed in claim 9 further comprising a second pattern of phase shift members configured to diffract exposure energy to provide off axis illumination for a selected portion of the mask pattern.

11. The mask as claimed in claim 9 wherein the phase shift members comprise a grating pattern having an orientation, layout and pitch selected to enhance printing of selected features of the mask pattern.

12. A lithographic mask comprising:
    a substrate having a first side and a second side;
    a primary mask pattern formed on the first side of the substrate comprising a patterned opaque layer having an alignment mark therein; and
    a pattern of phase shift members formed on the second side of the substrate in alignment with the alignment mark and selected portions of the primary mask pattern, the phase shift members comprising a transparent, patterned phase layer deposited on the second side to a thickness selected to phase shift and diffract exposure energy directed through the phase shift members relative to exposure energy directed through adjacent portions of the substrate to provide diffracted exposure energy for the primary mask pattern.

13. The mask as claimed in claim 12 wherein the phase shift members comprise a grating pattern oriented at an angle that is generally parallel to an orientation of the selected portions.

14. The mask as claimed in claim 12 wherein the phase shift members comprise a grating pattern oriented at an angle that is generally perpendicular to an orientation of the selected portions.

15. The mask as claimed in claim 12 wherein the phase shift members comprise a grating pattern oriented at an angle with respect to an orientation of the selected portions of between 1° to 89°.

16. The mask as claimed in claim 12 wherein the phase shift members comprise a grating pattern oriented at an oblique angle with respect to an orientation of the selected portions.

17. The mask as claimed in claim 12 wherein a thickness of the phase layer is selected to provide a phase shift of $\pi$ or odd multiple thereof.

18. A method for fabricating a lithographic mask comprising:
    providing a transparent substrate having a first side and a second side separated by a thickness of the substrate;
    forming an opaque layer on the first side of the substrate;
    forming an alignment mark in the opaque layer;
    forming a diffraction grating on the second side of the substrate in alignment with the alignment mark, the diffraction grating comprising a pattern of phase shift grooves etched in the second side of the substrate to a depth selected to diffract and phase shift exposure energy transmitted through the phase shift grooves relative to exposure energy transmitted through adjacent full thickness portions of the substrate; and
    forming a primary mask pattern in the opaque layer having at least a portion thereof in alignment with the alignment mark and the diffraction grating.

19. The method as claimed in claim 18 wherein forming the diffraction grating comprises etching the phase shift grooves to a depth selected to produce a phase shift of $\pi$ or odd multiple thereof.

20. A method for fabricating a lithographic mask comprising:
    providing a transparent substrate;
    forming an opaque layer on a first side of the substrate with a first alignment mark;
    depositing a layer of resist on a second side of the substrate;
    forming a second alignment mark in the layer of resist in alignment with the first alignment mark;

forming a resist mask by exposing a diffraction pattern on the layer of resist with a mask writer configured to view the second alignment mark and align the diffraction pattern with the second alignment mark;

forming a diffraction grating corresponding to the diffraction pattern on the second side of the substrate using the resist mask; and forming a mask pattern in the opaque layer by depositing a second layer of resist on the opaque layer and exposing the mask pattern in alignment with the diffraction grating using the mask writer.

21. The method as claimed in claim 20 wherein the diffraction grating comprises a line space pattern of etched grooves.

22. The method as claimed in claim 20 wherein the diffraction grating comprises a checkerboard pattern of etched grooves.

23. The method as claimed in claim 20 wherein the diffraction grating is generally perpendicular to the mask pattern.

24. The method as claimed in claim 20 wherein the diffraction grating is generally parallel to the mask pattern.

25. The method as claimed in claim 20 wherein an orientation of the diffraction grating is at an angle of from 1° to 89° with respect to the mask pattern.

26. A method for fabricating a lithographic mask comprising:

providing a transparent substrate with an opaque layer on a first side thereof;

forming a first alignment mark in the opaque layer;

forming a layer of resist on a second side of the substrate;

forming a second alignment mark in the layer of resist by exposing the layer of resist through the first alignment mark and developing the layer of resist a first time;

exposing the layer of resist using a mask writer configured to view the second alignment mark;

developing the layer of resist a second time to form a resist mask;

etching the second side of the substrate using the etch mask to form a diffraction grating comprising a pattern of phase shift grooves etched in a second side of the substrate to a depth selected to diffract and phase shift exposure energy transmitted through the phase shift grooves relative to exposure energy transmitted through adjacent full thickness portions of the substrate; and forming a mask pattern in the opaque layer in alignment with the first alignment mark and at least a portion of the diffraction grating.

27. The method as claimed in claim 26 wherein the diffraction grating comprises a line space pattern.

28. The method as claimed in claim 26 wherein the diffraction grating comprises a checkerboard pattern.

29. The method as claimed in claim 26 wherein forming the mask pattern comprises exposing a second layer of resist on the opaque layer and etching the opaque layer.

30. A lithographic system for exposing a layer of resist formed on a target, comprising:

an exposure source for providing an exposure energy;

a mask comprising:

a transparent substrate having a first side and a second side separated by a thickness;

a patterned opaque layer formed on the first side having a primary mask pattern and an alignment mark formed thereon; and a diffraction grating formed on the second side of the mask in alignment with the alignment mark, the diffraction grating comprising a pattern of phase shift grooves etched in the second side of the substrate to a depth selected to diffract and phase shift exposure energy transmitted through the phase shift grooves relative to exposure energy transmitted through adjacent full thickness portions of the substrate to provide off axis illumination for the mask pattern.

31. The system as claimed in claim 30 wherein a layout, orientation and pitch of the diffraction grating is selected to enhance an image of the mask pattern printed onto the target.

32. A lithographic system comprising:

an exposure source; and a mask placed between the exposure source and a target, the mask comprising:

a substrate having a first side and a second side;

a primary mask pattern formed on the first side, the mask pattern comprising a patterned opaque layer with an alignment mark;

a diffraction grating formed on the second side in alignment with at least a portion of the primary mask pattern, the diffraction grating comprising a transparent phase layer deposited and patterned with a thickness selected to form phase shifters configured to phase shift and diffract exposure energy directed through the phase shifters relative to exposure energy directed through adjacent portions of the substrate to provide diffracted exposure energy for the primary mask pattern.

33. The system as claimed in claim 32 wherein a layout, orientation and pitch of the diffraction grating is selected to enhance an image of the mask pattern printed onto the target.

34. The system as claimed in claim 32 wherein an orientation of the diffraction grating is generally perpendicular with respect to an orientation of the primary mask pattern.

35. The system as claimed in claim 32 wherein an orientation of the diffraction grating is generally parallel with respect to an orientation of the primary mask pattern.

36. The system as claimed in claim 32 wherein an orientation of the diffraction grating is from 1° to 89° with respect to an orientation of the primary mask pattern.

* * * * *